United States Patent [19]

Rockett, Jr.

[11] 4,206,446
[45] Jun. 3, 1980

[54] CCD A-TO-D CONVERTER

[75] Inventor: Leonard R. Rockett, Jr., Cranbury, N.J.

[73] Assignee: RCA Corporation, New York, N.Y.

[21] Appl. No.: 799,710

[22] Filed: May 23, 1977

[51] Int. Cl.$^2$ .......................................... H03K 13/09
[52] U.S. Cl. ........................ 340/347 AD; 340/347 M; 357/24
[58] Field of Search .... 340/347 M, 347 AD, 347 NT; 357/24; 307/221 C, 221 D

[56] References Cited

U.S. PATENT DOCUMENTS

| 3,758,794 | 9/1973 | Kosonocky | 307/304 |
| 3,777,186 | 12/1973 | Chang | 357/24 X |
| 3,876,952 | 4/1975 | Weimer | 357/24 X |
| 3,903,543 | 9/1975 | Smith | 357/24 |
| 3,930,255 | 12/1975 | Means | 340/347 AD |
| 3,958,210 | 5/1976 | Levine | 307/304 X |
| 3,969,634 | 7/1976 | Su et al. | 357/24 X |
| 4,115,766 | 9/1978 | Smith | 340/347 AD |

OTHER PUBLICATIONS

Bernadotte et al., Bucket Brigade Devices Arranged for Dividing . . ., IBM Technical Disclosure Bulletin, vol. 18, No. 8, 1/76, p. 2540.

Primary Examiner—Thomas J. Sloyan
Attorney, Agent, or Firm—H. Christoffersen; Samuel Cohen

[57] ABSTRACT

Analog signal is translated to charges which concurrently are spilled down a plurality of charge coupled device (CCD) channels. The CCD storage electrodes of these channels define potential wells at least some of which are of different size and the number of wells in each channel which receive charge as it attempts to fill the successive wells in that channel with depend upon the analog signal amplitude and the respective sizes of said successive wells. The presence or absence of charge in one or more of the storage wells in each channel is sensed and employed in some cases for indicating the value of a bit of given significance, and in others for inhibiting or permitting the propagation of charge along a CCD channel employed to indicate the value of a bit of lower significance.

9 Claims, 10 Drawing Figures

CCD A-TO-D CONVERTER

The present invention relates to analog-to-digital (A-to-D) converters.

There are many digital processing applications which require the translation of analog signal which may represent a parameter such as temperature, speed or a process variable as but a few examples, into a group of signals representing a binary number. The present application describes a system for performing this function which readily can be integrated, which operates at relatively high speed and which is relatively simple in construction.

The A-to-D converters embodying the present invention employ charge coupled devices (CCD's). These are illustrated schematically in the various figures which show only the more important ones of the electrodes, some of the diffusions in the substrate, and which show also some of the circuits in block diagram form. The CCD's are assumed to be of the surface channel type with a P-type substrate (N channel). It is to be understood, of course, that this is an example only as the system is equally operative with P-channel, surface channel CCD's and with buried channel CCD's. The substrate is not illustrated but is assumed to be present. The electrodes are illustrated as rectangles (which in some cases are suggestive of scale but which are often not to scale). It is to be understood that any of the conventional electrode structures (single layer, double layer, triple layer, and so on) may be employed and further that well-known techniques for obtaining potential barriers, such as ion implants, may be employed where required, and that barriers made in this way may be substituted for the transfer electrodes illustrated. The channels are illustrated in some cases by dashed lines. Where electrodes in such channels perform their conventional function, in some cases they are not shown and in others some of the electrodes are shown in phantom.

Figure 1:
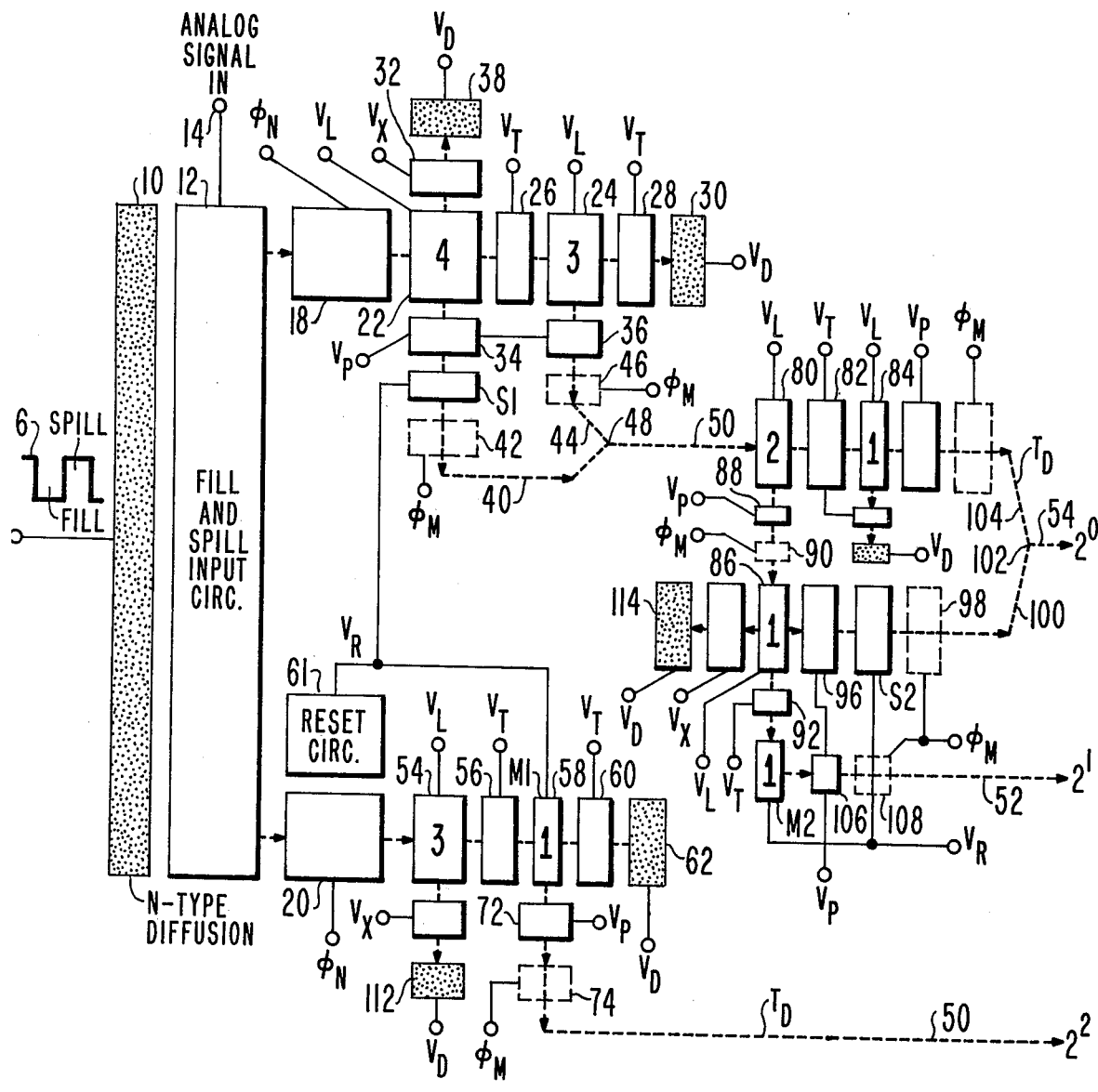
FIG. 1 is a schematic showing of an A-to-D converter embodying the invention.
Figure 5:
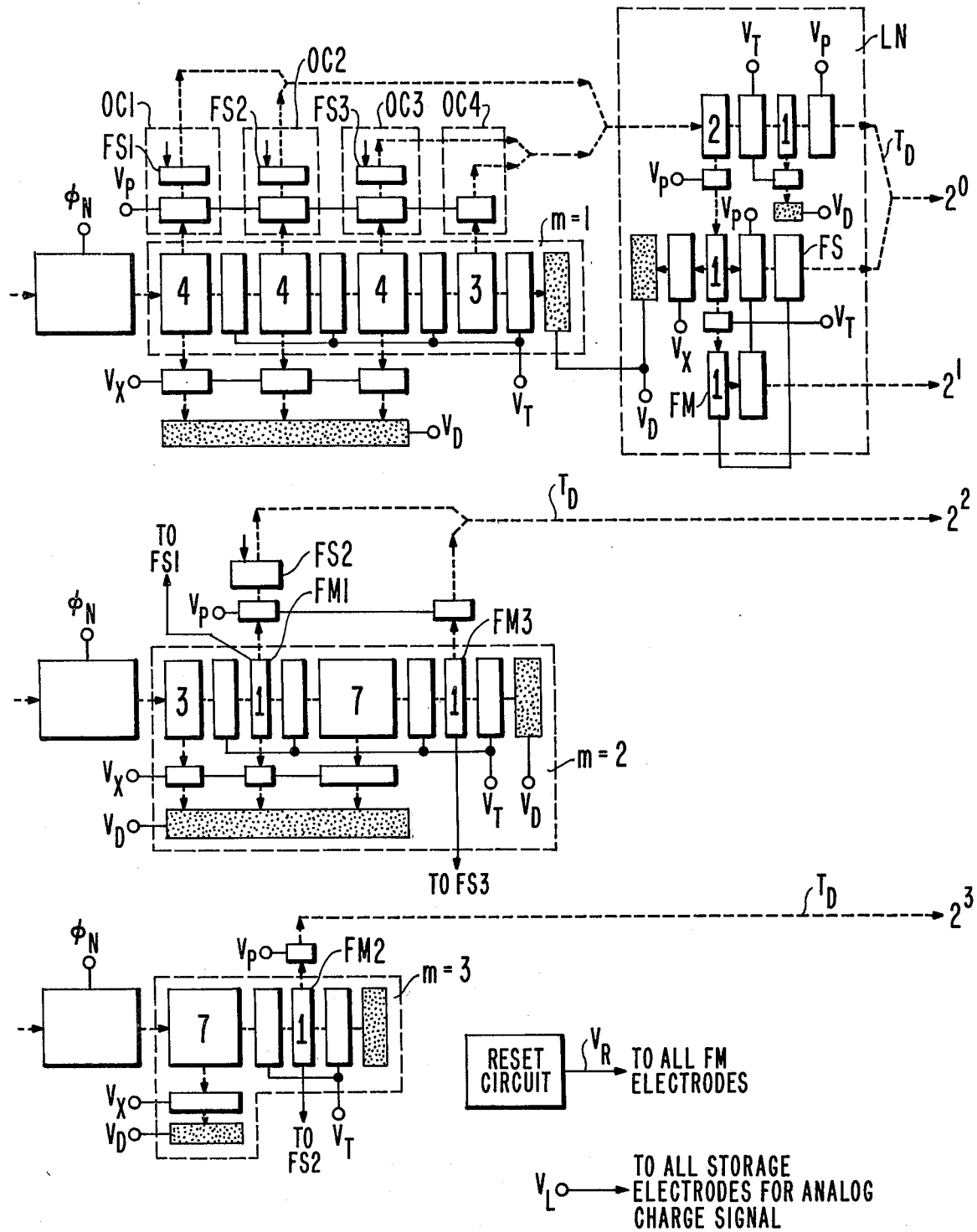
FIG. 5 is a schematic showing of a larger (four rather than three output bits) A-to-D converter embodying the invention.
Figure 6:
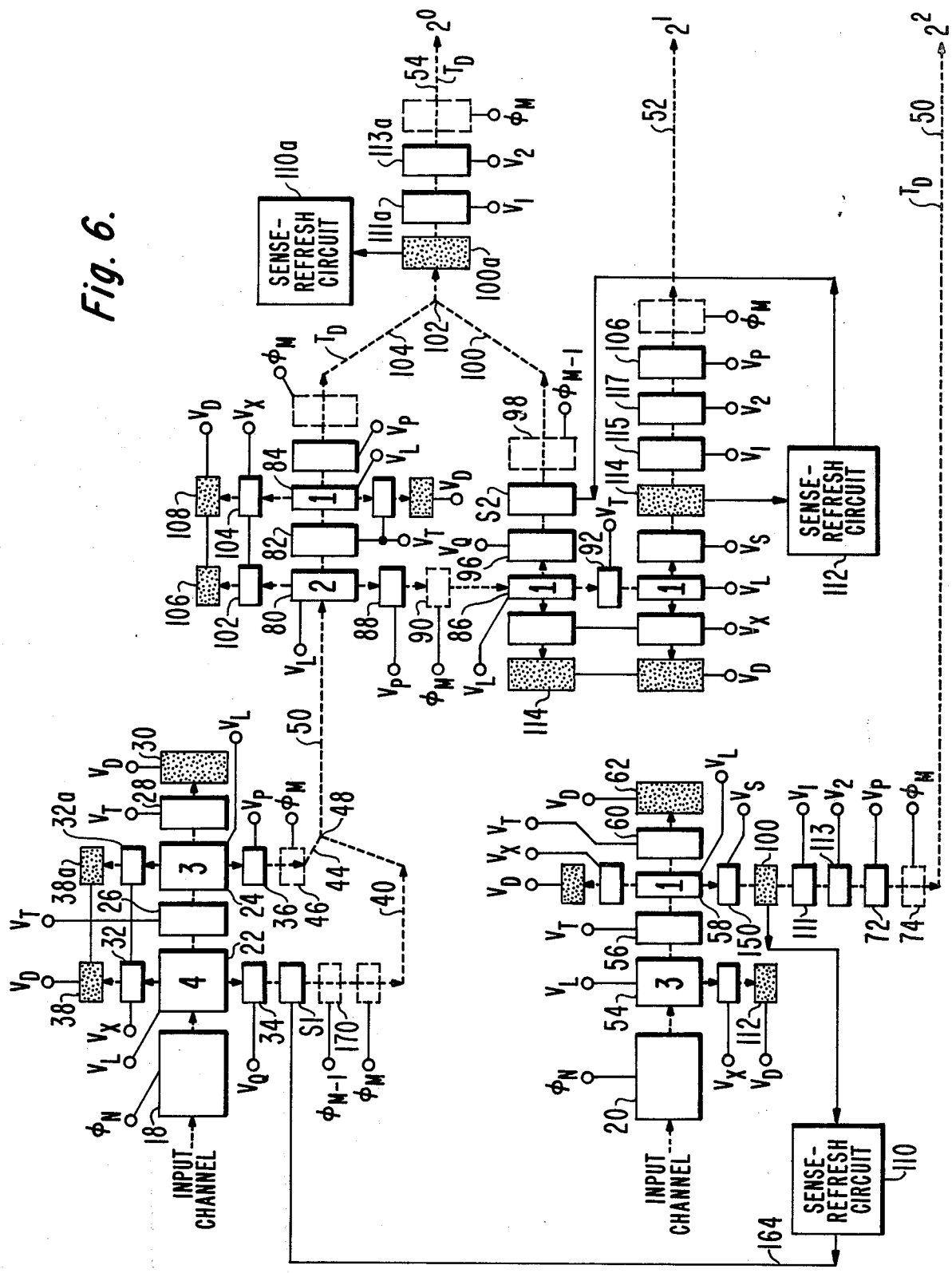
FIG. 6 is a schematic showing of a modified form of the A-to-D converter of FIG. 1.

FIGS. 1 and 5 are for the purpose of illustrating the principle of operation of two embodiments of the invention, one a three bit A-to-D converter and the other a four bit A-to-D converter. FIG. 6 illustrates a more practical realization of a three bit A-to-D converter operating on the same principle as the systems of FIGS. 1 and 5. FIGS. 1 and 5 are discussed first and this is followed by a discussion of the additions of FIG. 6.

The system of FIG. 1 includes an input diffusion 10; charge proportional to an input analog signal may be obtained therefrom in any conventional way. Preferably the system includes a fill and spill input circuit 12. Such a circuit is responsive to an input signal applied to input terminal 14 and a fill and spill waveform 16 applied to the diffusion 10, for producing charge packets of a magnitude proportional to the amplitude of the input signal. In the system of FIG. 1, there are two parallel CCD channels and the fill and spill circuit produces two charge packets of the same size, one in each channel. Fill and spill input circuits in themselves are known in the art and are described, for example, in U.S. Pat. No. 3,986,198 issued Oct. 12, 1976 to Walter F. Kosonocky. The circuit of the patent describes supplying a signal to a single CCD channel; however, the technique is equally applicable to the two channels shown in FIG. 1 and to the three channels shown in FIG. 5 and generally to any number of channels.

The charge signals produced in the manner described are propagated down the respective channels until they reach the storage wells beneath electrodes 18 in the upper channel and 20 in the lower channel. These signals become stored in these wells during a period of time that $\phi_N$ goes positive. The potential wells beneath electrodes 18 and 20 are sufficiently large to store a charge signal of the maximum size expected. In the present system, in which there are three output lines in which signals indicative of a three bit word may be produced, $2^3$ or eight binary values may be represented. The minimum value binary word 000 represents zero charge and the maximum value binary word 111 represents seven arbitrary units of charge. Thus, the potential wells beneath electrodes 18 and 20 will each be sufficiently large to store seven arbitrary units of charge.

The upper channel illustrated includes storage electrodes 22 and 24, transfer electrodes 26 and 28 and a drain diffusion 30. This diffusion as well as the other drains may be formed of N-type silicon. The storage wells have capacities in the relative proportions four and three as indicated by the numerals 4 and 3 within the rectangles, where 4 and 3 represent also arbitrary units of electrode area. Thus, electrode 22 can store in its potential well only four units of charge compared to three units of charge which can be stored beneath electrode 24 (and the seven units of charge which can be stored beneath electrode 18). The electrodes 26 and 28 are for the purpose of providing surface potential barriers, in one case providing isolation between potential wells and in another for providing isolation between a potential well and the drain diffusion. These functions will be discussed in more detail shortly.

The areas above represented by numbers such as 4 and 3 may be in arbitrary units such as mils$^2$, as an example. In general, the arbitrary area units selected will be as small as possible, consistent with the photolithographic techniques available to produce the smallest area electrode needed in a system. The relative input analog signal level will be scaled during the fill and spill process, to produce in response to the maximum analog signal to be handled, seven arbitrary charge units (a total amount of charge sufficient to fill the two wells beneath electrodes 22 and 24). Note that $\phi_N$, when at its high level is more positive than $V_L$. Therefore electrodes 18 and 20 can be scaled relatively smaller than the scaling of electrodes such as 22 and 24. This is advantageous as a smaller electrode dimension in the direction of charge propagation permits higher charge transfer speed.

The upper channel also includes an electrode 32 controlled by a voltage $V_x$ and electrodes 34 and 36 controlled by voltage $V_P$. A drain diffusion 38 is located adjacent to electrode 32 and a slave electrode S1 is located adjacent to electrode 34. Electrode S1 is called a slave electrode because its potential is controlled by the potential of a master electrode M1 in a manner to be discussed shortly.

Following the slave electrode S1, is a CCD channel 40, the first electrode of which is shown in phantom at 42. Following the electrode 36 there is another CCD channel 44, the first electrode of which is shown in phantom at 46. The two channels 40 and 44 merge at 48 into a common CCD channel 50. This common channel leads to another group of electrodes which will not be described in detail here but which will be discussed later in connection with the operation. The details of the electrodes following electrode 20 also will be given in connection with the discussion which follows.

In the discussion which follows of the operation of the system, FIGS. 1-4 should be referred to. The input analog signal present at 14 is translated by the fill and spill input circuit to charges which appear under electrodes 18 and 20, respectively. These charges are at levels proportional to the input signal level and will be translated by the system shown to binary output levels at the three CCD output channels 50, 52 and 54, in accordance with Table I which follows.

TABLE I

| ANALOG SIGNAL LEVEL | BINARY OUTPUT |
|---|---|
| 0 | 000 |
| 1 | 001 |
| 2 | 010 |
| 3 | 011 |
| 4 | 100 |
| 5 | 101 |
| 6 | 110 |
| 7 | 111 |

Assume for the purpose of the present discussion that the signal is at the 5 level and has been translated into five units of charge. These five units of charge are present in the potential wells beneath each of electrodes 18 and 20. When $\phi_N$ goes low, the charge present in the potential well beneath electrode 20 flows out of that well and into the potential well beneath electrode 54. The well beneath this electrode has a capacity of only three units of charge. Therefore, the excess of two units of charge flows over the potential barrier beneath transfer electrode 56 and into the potential well beneath electrode 58. Electrode 58 may be a floating gate electrode or, alternatively, may be a floating diffusion. For purpose of the present discussion, the former may be assumed and it may also be assumed that prior to the reception of charge by the potential well beneath electrode 58, this electrode has been reset by the reset circuit 61 to a reference level $V_R$. This reference level and the size of electrode 58 are such that the potential well beneath 58 can store only one unit of charge. The remainder of the charge flows over the barrier beneath electrode 60 to the drain diffusion 62.

Figure 3:
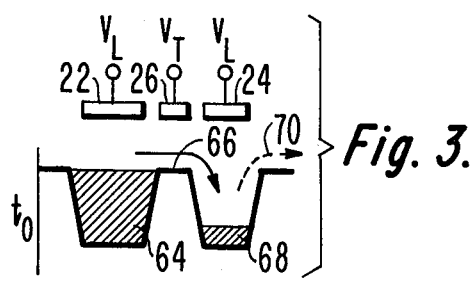
FIGS. 3 and 4 are drawings of surface potential profiles to help illustrate the operation of the circuit of FIG. 1.
Figure 4:
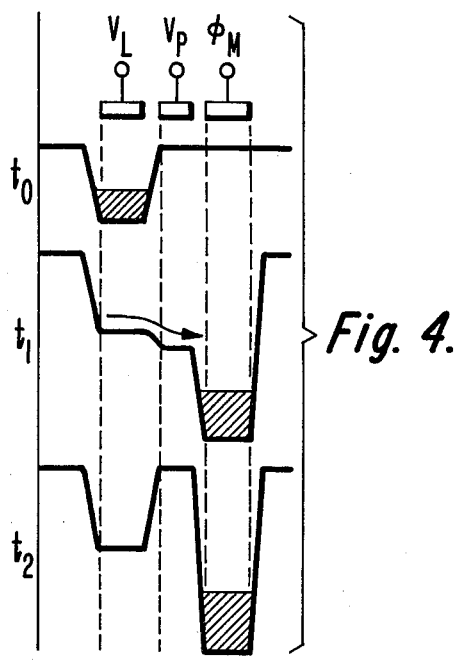

The filling of the wells beneath electrodes 54 and 58 is comparable to what is shown in FIG. 3 which does not illustrate these electrodes but rather electrodes in the upper channel. Charge flows from the left and fills the first potential well 64 which would be comparable to a well beneath electrode 54. As the charge is in excess of that which can be contained in this well, the excess flows over potential barrier 66 beneath the transfer electrode. This transfer electrode is comparable to electrode 56. The excess charge then flows into the following well 68. In the example just given where the following well such as 68 has a capacity of one unit of charge, and two units of charge are spilled into this well, the remainder will flow out of this well as indicated by the dashed line 70 and in the example of the lower channel, will flow to diffusion 62.

Figure 2:
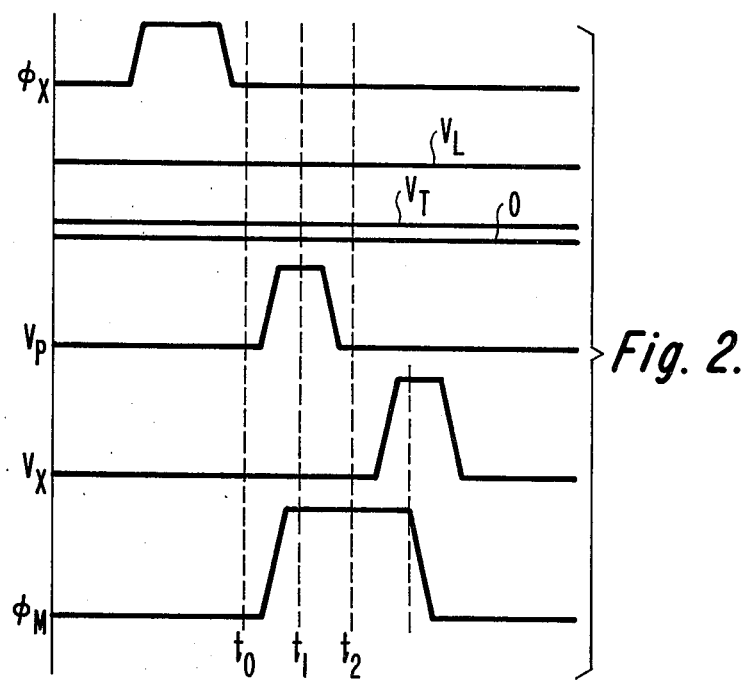
FIG. 2 is a drawing of waveforms employed in the operation of the system of FIG. 1.

After the wells beneath electrodes 54 and 58 have received charge in the manner just discussed, the control voltage $V_P$ goes high as shown in FIG. 2. At the same time the multiple phase voltage $\phi_M$ goes high at a more positive voltage level than $V_P$. The result is the emptying of the potential well beneath electrode 58, the charge flowing via the conduction path beneath electrode 72 to the potential well beneath electrode 74. This is comparable to the operation at times $t_0$ and $t_1$ in FIG. 4, where the electrode operated by $V_L$ is comparable to electrode 58 (even though electrode 58, in this example, happens to be a floating gate electrode operated by $V_R$) and the electrode operated by $V_P$ is comparable to electrode 72.

After time $t_1$, that is, at time $t_2$, $V_P$ goes low and the charge is isolated in the well beneath electrode 74 by the potential barrier produced beneath electrode 72. Thereafter, charge stored beneath electrode 74 is propagated by the following electrodes (not shown) to the $2^2$ bit output terminal. Since a charge is present, the $2^2$ bit is a 1. This is consistent with Table I which shows that the most significant bit, that is, the $2^2$ bit of the three bit output word, is a 1 for the analog signal level of five. It may further be observed that with the electrode sizes illustrated for electrodes 54 and 58, any time the charge signal is at an analog level of four or more, the same thing as described occurs in the lower channel, that is, the $2^2$ bit is equal to 1. This is consistent with Table I.

Returning now to FIG. 1, when $\phi_N$ is high, there are five units of charge beneath electrode 18. When $\phi_N$ goes low, the well beneath 18 empties and four of the units of charge spill into the well beneath electrode 22 and the additional one unit of charge, which is in excess, flows over the barrier beneath electrode 26 and into the potential well beneath electrode 24. This action is illustrated in FIG. 3 and it occurs concurrently with emptying of the potential well 20 in the lower channel as already described.

After the charge has settled in the wells beneath electrodes 22 and 24, the voltage $V_P$ goes high and the charge from the well beneath electrode 22 attempts to flow to the potential well beneath electrode 42. However, the voltage present at the master electrode 58 is conducted to the slave electrode S1 and is of a level such as to produce a potential barrier beneath slave electrode S1. This is the well-known inversion which is produced by this kind of circuit. The barrier beneath electrode S1 prevents charge from passing to channel 40. At the same time, however, the voltage $V_P$ applied to electrode 36 causes the one unit to charge beneath electrode 24 to pass to the well beneath electrode 46. Subsequently, the charges are propagated down channels 44 and 40 to 48 where they join. As there is no charge present in channel 40 and one unit of charge present in channel 44, the combination of these two quantities results in one unit of charge at 50. At a later time this one unit of charge reaches electrode 80 where it partially fills the well beneath electrode 80. There is no overflow because the well beneath 80 has a two unit storage capacity so no charge passes over the barrier beneath transfer electrode 82 and no charge enters the potential well beneath electrode 84.

At a later time, the control voltage $V_P$ again occurs and the charge present beneath electrode 80 passes via the conduction path beneath 88 to the well beneath electrode 90. This charge now is propagated down the CCD channel of which 90 is the first multiple phase electrode to the potential well beneath electrode 86. This potential well has a capacity of one charge unit. As there is only a single unit of charge present beneath 86, it cannot flow over the transfer barrier beneath electrode 92. Therefore, the potential well beneath the master electrode M2 will not receive any charge and the slave electrode S2 connected thereto will have a conduction path therebeneath. Accordingly, when the voltage $V_P$ goes high charge will flow from beneath electrode 86 via the conduction path beneath 96 and S2 to the potential well beneath the storage electrode 98 shown in phantom. At a later time, this charge will flow down channel 100 in response to the multiple phase voltages and will be combined at the merge point 102 between the channels 100 and 104 with the charge present in channel 100. Any time there is charge present in channel 100, there will be no charge present in channel 104 so that the combined charge in output channel 54 will be one unit of charge. Accordingly, the $2^0$ bit is a 1.

It was previously stated that in the example given, there will be no charge present beneath electrode M2. Accordingly, when $V_P$ occurs, there will be no charge conducted via the conduction path beneath electrode 106 to the potential well beneath the electrode shown in phantom at 108. Therefore, there will be no charge propagated down the output channel 52. Therefore, the $2^1$ bit is of value 0.

Summarizing what has been said to this point, an input charge of five units has been produced in response to an analog signal of five units at 14. This input charge has been translated to the binary word 101 which is the binary equivalent of five.

To continue the operation, after the control voltage $V_P$ occurs, the control voltage $V_x$ occurs with the timing being as shown in FIG. 2. The purpose of voltage $V_x$ is to clear the charge which may be present in a potential well in anitcipation of a new period of operation. For example, in the present instance, when $V_x$ occurs the four units of charge beneath electrode 22 pass to the drain diffusion 38. Similarly, the three units of charge beneath electrode 54 pass to the drain diffusion 112. Similarly, at a later time when $V_x$ again occurs, if there is any charge present beneath electrode 86, it passes to the drain diffusion 114. In theory, at least, any charge present beneath electrode such as 24 has been propagated to a new location. The same holds for the charge present beneath electrode 80. However, in practice it may be desirable to add for each such electrode, a drain diffusion and gate electrode driven by a voltage $V_x$, operated in the same manner as the analogous structures already mentioned, to insure that any undesired charge which may have accumulated due to thermal or other effects is cleared before the next operating cycle. An embodiment which includes such structure is discussed later.

In the present arrangement, it should be clear from the discussion above that some of the output bits become available sooner than others. For example, the most significant bit is available as a charge beneath electrode 74 after only one period of the control voltages $V_P$ and $V_x$. The less significant bits are not available until later. If one desires to have the three output bits present concurrently at the three output terminals of the system, it is necessary to insert additional delays in some of the output channels as indicated by the notation $T_D$. This may be accomplished simply enough by placing additional multiple phase electrodes in these channels.

The operation of the system of FIG. 1 can be traced for the other values given in Table I and it will be found that the required outputs are produced. To help the reader in this analysis, one other example will be given and that is the translation of the analog level 2 to binary 2. In brief, two units of charge eventually pass to the wells beneath electrodes 54 and 22. No charge passes to the well beneath electrode 58 as the well beneath 54 does not overflow. Therefore, no charge passes to output channel 50 so that the $2^2$ bit is zero.

In the upper channel, well 22 does not overflow so that no charge passes to the well beneath electrode 24. When $V_P$ occurs, the two units of charge beneath electrode 22 pass to channel 40 as the slave electrode S1 produces a conduction path beneath this electrode. The two units of charge subsequently pass via channel 50 to electrode 80. There is no overflow to electrode 84 as the well beneath electrode 80 has a capacity of two units of charge. Accordingly, there is no charge in channel 104. When $V_P$ occurs, the two units of charge pass to the well beneath electrode 90 and they subsequently are sent down the channel of which electrode 90 is the first electrode, eventually reaching electrode 86. The well beneath this electrode has a capacity of one unit of charge and the excess passes over the barrier beneath electrode 92 to the well between master electrode M2. This charge now causes a blocking voltage to be applied from the master electrode M2 to the slave electrode S2. A potential barrier therefore forms beneath electrode S2 and prevents charge from entering channel 100. As there is no charge in either channel 100 or 104, no charge appears in output channel 54 and the $2^0$ bit therefore is zero.

When $V_P$ occurs, the charge present beneath floating gate M2 propagates to beneath electrode 108 and subsequently appears as a 1 at output channel 52. This is the $2^1$ bit. Therefore, the analog signal of level 2 has been translated to its binary equivalent of 010 as required in Table I.

The system of FIG. 1 is an example only. It is of course to be understood that systems with greater resolution are possible and within the scope of the present invention. One such system which is capable of producing a four bit output word and therefore which is capable of translating sixteen analog levels (0–15) to a four bit output word in the manner shown in Table II below is illustrated in FIG. 5.

TABLE II

| ANALOG SIGNAL LEVEL | BINARY OUTPUT |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |

TABLE II-continued

| ANALOG SIGNAL LEVEL | BINARY OUTPUT |
|---|---|
| 8 | 1000 |
| 9 | 1001 |
| 10 | 1010 |
| 11 | 1011 |
| 12 | 1100 |
| 13 | 1101 |
| 14 | 1110 |
| 15 | 1111 |

The operation of the system of FIG. 5 should be easy to follow from the detailed discussion of FIG. 1, as the principles are exactly the same. In FIG. 5 the drawing has been somewhat simplified. The input diffusion and the fill and spill input circuit are implied but not shown explicitly. The storage electrodes are illustrated in a manner similar to what is shown in FIG. 1 with the numbers indicating the capacity of the corresponding storage wells. These wells all receive a voltage level $V_L$; however, to simplify the drawing the connections to $V_L$ are not shown. The master floating gate electrodes are identified by the letters FM followed by a number and the slave electrodes they control are identified by FS followed by a corresponding number. The gate electrodes in the channels are to be implied but are not shown explicitly. The voltages employed are as illustrated in FIG. 2.

A feature of the present system is that, in practice, differences in operating parameters from one mass-produced chip to another should not affect the operation. The potential well capacity on any particular chip is a function of the gate electrode area and the channel oxide thickness. The relative areas of these electrodes on any particular chip can be very accurately controlled using modern photolithographic manufacturing techniques, as commonly employed in the CCD technology. The oxide coating on a particular chip is relatively uniform over the entire chip, that is, beneath all gate electrodes on the chip. The oxide thickness may vary from one chip to another; however, this does not affect the accuracy of the A-to-D conversion on any one of the chips. So long as it is relatively uniform on any one chip, the gate thresholds will be relatively uniform on that chip and this is what is of interest.

As mentioned in the introductory portion of the present application, FIG. 1 illustrates the principles of operation of a three bit A-to-D converter embodying the invention. In practice, it is desirable to empty all of the storage wells of any residual charge once each operating period (each time $V_x$ occurs) by providing a drain for each such well and a suitable gate between the well and the drain. It is also desirable to provide some means for translating the voltage present at a master electrode (or a master floating diffusion) to one of two discrete, amplified levels for application to a slave electrode. This voltage at the master element is not necessarily at one of two discrete levels. This voltage, when it changes to represent a 1, may change from its reference level $V_{DD}$ by an amount in the range $\Delta V_1/2$ to $\Delta V_1$, where $\Delta V_1$ is the voltage change for a full well charge beneath electrode 58. Similarly, when it changes to represent a 0, may change from its reference level $V_{DD}$ by an amount in the range 0 to approximately $\Delta V_1/2$. A circuit which includes these features is shown in FIG. 6. This circuit also includes a means for standardizing the charge level at the input to output CCD channels (such as 50) to a reference level indicative of a binary 1 or a binary 0. In other words, if a signal with charge magnitude greater than ½ full well is present at a floating diffusion such as 100 in FIG. 6, this signal will be standardized to a full charge signal and alternatively, if there is a charge signal present which is less than ½ full well, it will be standardized to a charge signal at the binary 0 reference level.

FIG. 6 should now be referred to. The elements in FIG. 6 which are similar in function and operation to analogous elements in FIG. 1 are identified by similar reference characters. The additional elements in the circuit are identified by new reference characters. One difference between the system of FIG. 6 and that of FIG. 1 is that in the former, there are additional charge drain circuits. For example, there is an additional control electrode 32a adjacent to electrode 24 and a drain diffusion 38a following electrode 32a. The purpose of these elements is to insure that potential well 24 is emptied after each operating period. Gate electrodes 102 and 104 and drains 106 and 108 perform similar functions for elements 80 and 84, respectively.

The circuit of FIG. 6 also includes three sense-refresh circuts 110, 110a and 112, respectively. Circuit 110 senses the voltage present at the floating diffusion 100 and drives the slave electrode S1 in response thereto at standardized amplified voltage levels. This circuit and the additional electrodes 111 and 113 also translate the voltage present at floating diffusion 100, when it represents a zero, to a standard zero level in the potential well beneath electrode 113 and translate the voltage present at 100, when it represents a 1, to a standard 1 level beneath electrode 113. The circuit 112 and electrodes 115 and 117 perform a similar function for floating diffusion 114. The circuit 110a and its associated electrodes translate the voltage present at floating diffusion 100a to a standard 1 or 0 level.

Figure 7:
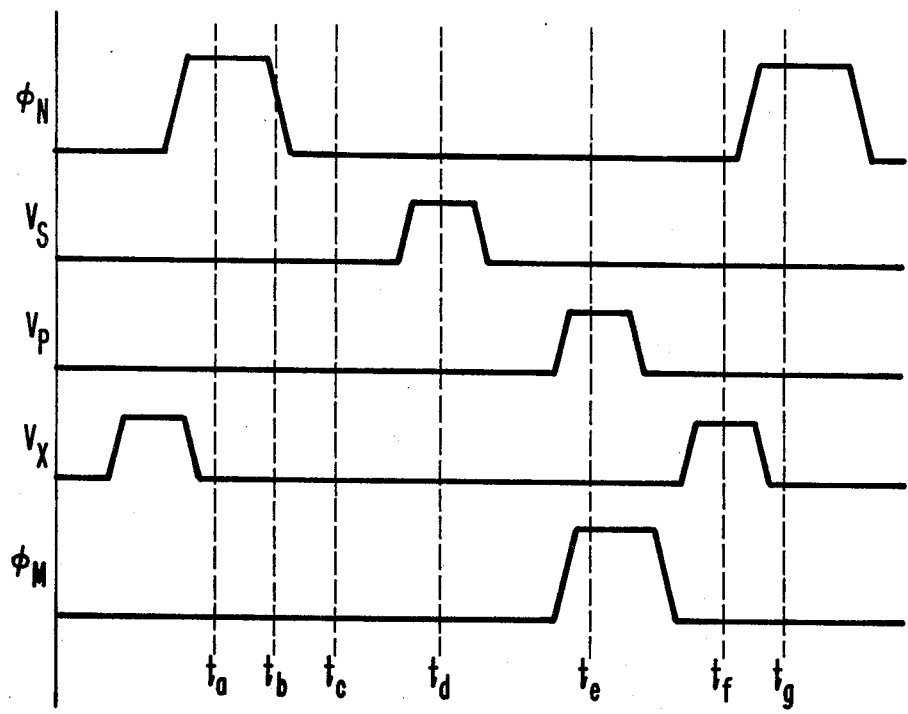
FIG. 7 is a drawing of waveforms to help explain the operation of the system of FIG. 6.
Figure 8:
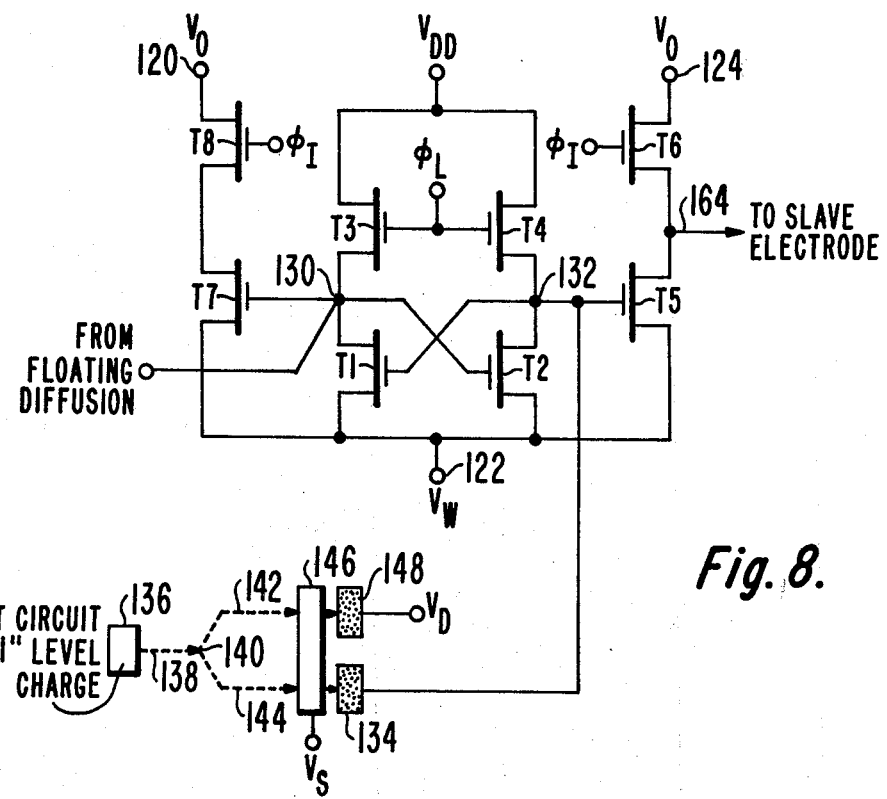
FIG. 8 is a schematic drawing of the sense refresh circuit of FIG. 6.
Figure 9:
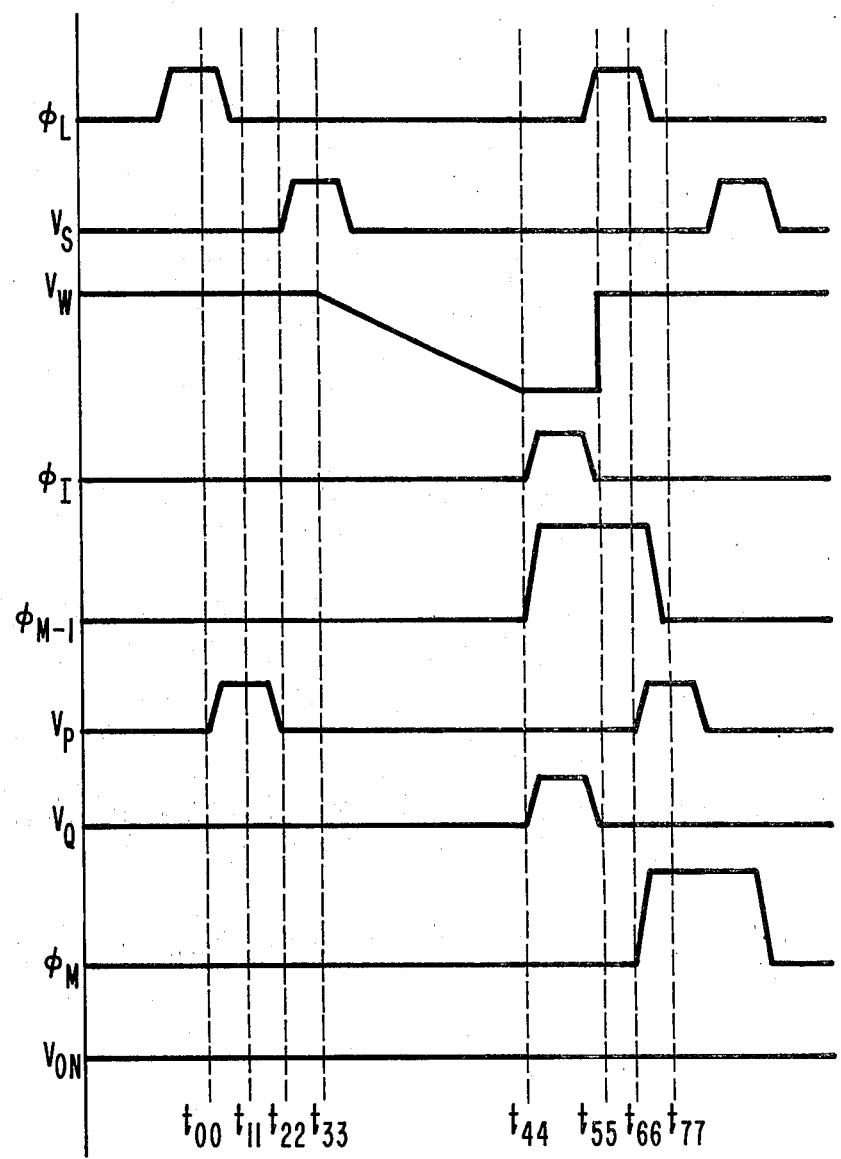
FIG. 9 is a drawing of waveforms employed in the operation of the circuit of FIG. 8.

FIG. 7 shows the operating voltage waveforms employed in the circuit of FIG. 6; FIG. 8 shows the details of a sense-refresh circuit such as 110, 110a or 112; and FIG. 9 shows the operating voltage waveforms employed in the circuit of FIG. 8. This circuit comprises eight transistors T1–T8, respectively. The transistors are all N-channel, field-effect transistors. An all-P-channel sense-refresh circuit would be used with the design of a P-channel CCD A-to-D converter. Transistors T1–T4 all have the same conduction path impedance, when they conduct. Transistors T6 and T8, when they conduct, have much higher conduction path impedances than transistors T5 and T7, respectively, when they conduct. The conduction channels of transistors T7 and T8 are connected in series between terminal 120 for an operating voltage and terminal 122 for a second operating voltage. The conduction channels and transistors T6 and T5 are similarly connected between terminals 124 and 122. The transistors T1–T4 are interconnected to form a balanced detector. The pair T8, T7 matches the pair T6, T5 in electrical characteristics. The only purpose of the pair T8, T7, in the present circuit, is to present a load at node 130 which exactly balances the load at node 132 to assure balanced operation of the detector.

The operation of the circuit of FIG. 8 may be better understood by referring to FIGS. 6, 8 and 9. The voltages $V_{DD}$ and $V_0$ are positive DC levels. At time $t_{00}$, when $\phi_L$ is high, transistors T3 and T4 are on and circuit nodes 130 and 132 are reset to the $V_{DD}$ referene level. Node 130 is connected to a floating diffusion such as 100 (FIG. 6) and this resets the floating diffusion to this reference voltage level. Node 132 is connected to another floating diffusion 134, shown in FIG. 8, so that this diffusion also is reset to the $V_{DD}$ reference level. Thereafter, $\phi_L$ goes low, turning off transistors T3 and T4. A charge signal concurrently is being propagated from an input circuit for a one level charge, shown schematically as a block 136, down a CCD channel 138. This channel divides into two channels at point 140. One half the charge then propagates to the upper channel 142 and the other half to the lower channel 144.

At time $t_{33}$, when $V_S$ is high, the charge signal present in channel 144 propagates via the conduction path beneath electrode 146 to the floating diffusion 134. This changes the voltage at 132 by an amount $\Delta V_1/2$ so that node 132 is established at the reference level $V_{DD} - \Delta V_1/2$. At the same time, the charge present in channel 142 is shifted to a drain diffusion 148 where it is conducted away.

At time $t_{33}$, when $V_S$ is high, charge present beneath an electrode such as 58 (FIG. 6) has been conducted via the conduction path beneath electrode 150 to the floating diffusion 100. This floating diffusion is directly connected to node 130 of the differential signal detector of FIG. 8. Assume that the charge (electrons) represents a 1 and that it is therefore greater than ½ the charge required to represent a binary 1.

Recapitulating what has occurred to this point, node 132 has been set to a reference level equal to $V_{DD} - \Delta V_1/2$. Node 130 in this example has been placed at a voltage level $V_{DD} - \Delta V_2$, where $\Delta V_2 > \Delta V_1/2$.

At time $t_{33}$, the voltage $V_W$ applied to terminal 122 which connects to the source electrodes of transistor T1 and T2, starts to go negative (actually less positive) from its high level of $V_{DD}$. This voltage is of a sense to tend to turn on transistors T1 and T2. Node 130 connects to the gate electrode of transistor T2 and node 132 to the gate electrode of transistor T1. As node 130 is more negative than node 132 in this example, transistor T1 will tend to turn on before transistor T2. In due course a point will be reached at which this, in fact, does occur. Transistor T1 goes on and conduction occurs through this transistor. That is, electrons flow from terminal 122 to node 130 making node 130 even more negative. This more negative voltage at node 130 maintains transistor T2 off. Thus, the circuit has assumed a condition at which node 130 follows the negative voltage level $V_W$ and node 132 remains at the reference level $V_{DD} - \Delta V_1/2$.

The circuit is in this condition at time $t_{44}$, when $V_W$ is at its most negative level. Immediately, thereafter, the pulse $\phi_I$ occurs and this turns on transistor T6. Transistor T5 also is on at this time. Therefore, conduction occurs from terminal 124 through the conduction paths of transistor T6 and T5 to terminal 122. As already mentioned, transistor T5, when it conducts, has a relatively low conduction path impedance and transistor T6, which operates as a load, has a relatively high conduction path impedance. (Such low and high impedances readily are obtained during the manufacturing process by appropriate selection of the conduction path dimensions.) Thus, when $\phi_I$ occurs, the voltage at output lead 164 goes close to the most negative $V_W$ level.

As may be seen in FIG. 9, the positive-going levels $V_Q$ and $\phi_{M-1}$ occur immediately after time $t_{44}$. In the example being discussed, at time $t_{44}$ a voltage close to $V_W$ is present on lead 164 at this time. This voltage is selected to be sufficiently negative to create a potential barrier beneath slave electrode S1 of FIG. 6 of sufficient height to prevent the passage of charge from beneath electrode 34 to beneath the first multiple phase electrode 170 in CCD channel 140. Thus, no charge (equivalent to zero) is propagated to this channel.

Suppose now that the charge which had been propagated to the floating diffusion 100 were less than ½ that required to represent a binary 1, that is, suppose the charge represented a binary zero. In this case the balanced detector would have been switched to its second state during the period between times $t_{33}$ and $t_{44}$, that is, transistor T1 would have remained off and transistor T2 would have been turned on. This means that node 132 would be at the most negative $V_W$ level at time $T_{44}$. In this case transistor T5 will remain off when the positive $\phi_I$ pulse occurs so that lead 164 is placed at the positive $V_0$ level when the pulse $\phi_I$ occurs. This positive level is chosen to be sufficiently high to create a conduction path beneath slave electrode S1. Accordingly, if there is charge beneath electrode 22 of FIG. 6, then when $V_Q$ goes positive between times $t_{44}$ and $t_{55}$, charge is conducted via the conduction paths beneath electrodes 34 and S1 to the potential well beneath electrode 170. Note that at time $t_{44}$, the multiple phase voltage $\phi_{M-1}$ goes positive creating a storage potential well beneath electrode 170.

Any charge which passes to the storage potential well 170 subsequently is propagated along the CCD channel 40 to the merge point 48 and thence along the CCD channel 50 to the storage well beneath electrode 80 in a manner similar to that already discussed in connection with FIG. 1. As in the case of FIG. 1, it can be shown that when charge passes to CCD channel 40, no charge passes to CCD channel 44. This same condition holds for other merging channels, that is, in any case where two CCD channels merge in the system of FIGS. 1, 5 or 6, there is charge present in only one of these channels.

Figure 10:
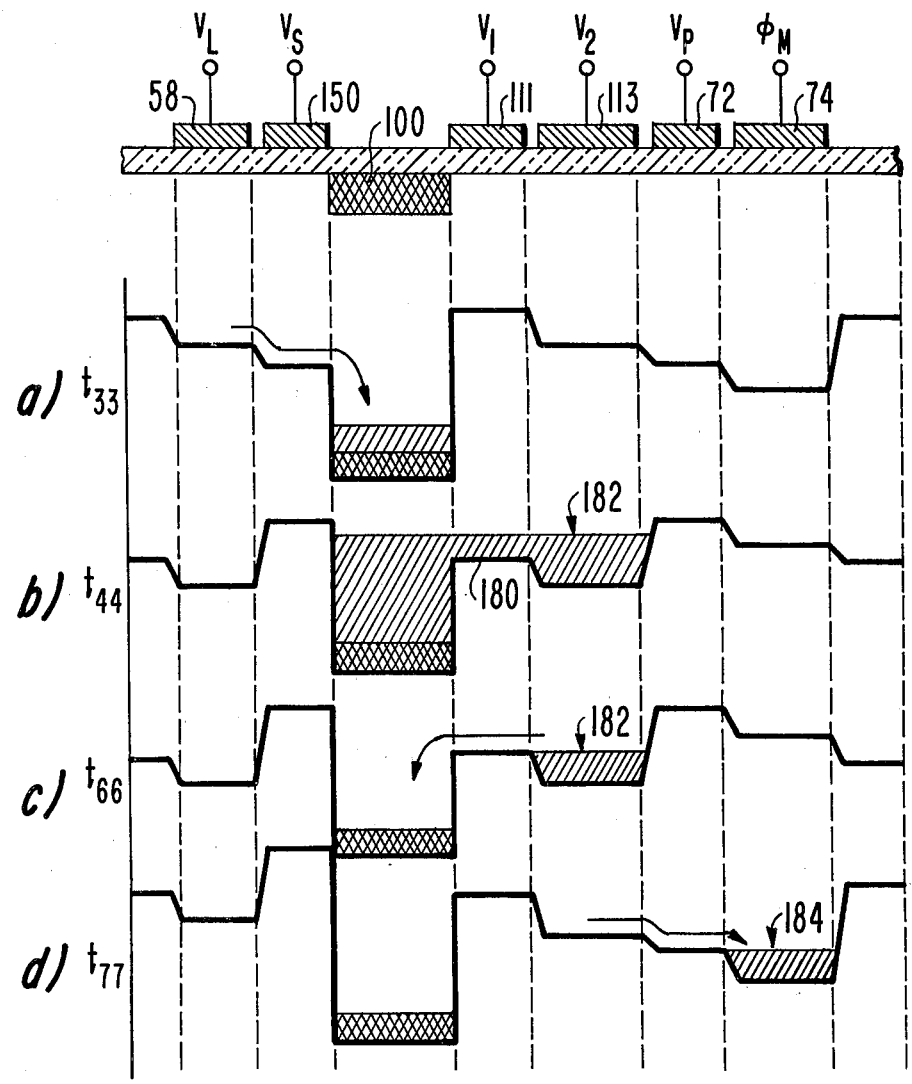
FIG. 10 is a drawing of surface potential profiles to help explain the operation of the system of FIG. 6.

There will now be discussed what occurs in the CCD channel which follows a floating diffusion such as 100. FIGS. 9 and 10 should be referred to in this discussion. It should be pointed out that the time scale in FIG. 9 is an expanded version of the time scale in FIG. 7. The degree of expansion may be seen by observing the relative positions of the $V_S$ and $V_P$ pulses. Note that the pulse $V_Q$ occurs between these two pulses as does the $\phi_I$ pulse.

At time $t_{33}$, when $V_S$ is positive, charge flows from the storage well beneath electrode 58 via the conduction path beneath electrode 150 to the floating diffusion 100. Assume that there is charge present at the 1 level. The flow of this charge is represented at a in FIG. 10. The voltage $V_2$ applied to electrode 113 is more positive than the voltage $V_1$ applied to electrode 111 and both voltages are DC levels. Thus, there is a potential barrier beneath electrode 111 and a potential well beneath electrode 113. The voltages are so chosen that the well beneath electrode 113, when it is full, represents a binary 1 and in this example, when it is empty, represents a binary 0.

At time $t_{44}$, when the voltage $V_W$ is at its most negative level, the floating diffusion 100 is also placed at its most negative level, assuming that the floating diffusion 100 already is storing a binary 1 charge signal. It should be recalled that under these circumstances, transistor T1 of FIG. 8 is conducting. The situation is as depicted at b in FIG. 10. The excess electrons which propagate to floating diffusion 100 overfill the potential well at the floating diffusion and flow over the potential barrier 180 beneath electrode 111 and into the potential well 182. The direct voltage level $V_1$ applied to electrode 111 is carefully chosen so that what is described does occur when the charge initially stored in the floating diffusion 100 represents a binary 1. (When the charge initially stored in the floating diffusion represents a binary 0, then transistor T1 remains off at time $t_{44}$ so that no flooding of the potential well at the floating diffusion 100 occurs and no charge enters potential well 182.)

At a later time $t_{66}$, which is after the pulse $\phi_I$ has occurred and is after the time that the sense refresh circuit 110 has placed the slave electrode S1 at the desired voltage level, the surface potential profiles are as indicated at c in FIG. 10. The voltage $V_W$ has returned to its most positive level; this has turned off transistors T1 and T2. The voltage $\phi_L$ is positive and this has turned on transistors T3 and T4. Therefore, the electrons present at node 130, that is, electrons in the floating diffusion, have been withdrawn from the floating diffusion and passed through the conducting transistors T3 to the $V_{DD}$ supply which is operating as a drain for these electrons. Thus, the excess charge carriers present in potential well 182 beneath electrode 113 have spilled out of this well, have returned to the floating diffusion and from there have been drained away.

What has just been described is a "fill and spill" circuit which is built into the input end of CCD output channel 50. What this circuit does is to translate any charge signal present at the floating diffusion 100 which is at a level between $\frac{1}{2}$ and one times that of the binary 1 level to the true binary 1 level (the full capacity of potential well 182). It also translates any charge which is between zero and somewhat less than $\frac{1}{2}$ that required to represent a binary 1 into a true binary 0 level (no charge in potential well 182).

Shortly after time $t_{66}$, the voltages $V_P$ and $\phi_M$ occur. They cause any charge present in the potential well 182 beneath electrode 113 to propagate to the storage well 184 beneath electrode 74. This is shown at d in FIG. 10. Thereafter, this charge is propagated along CCD channel 50 to the $2^2$ output terminal.

The operation of the sense refresh circuit 112 is analogous to that of the sense refresh circuit 110. The circuit elements 100a, 110a, 111a, 113a perform a refreshing function in CCD channel 54 which is analogous to the refreshing function performed by elements 100, 110a, 111, and 113 in channel 50. However, circuit 110a does not drive a slave electrode.

The circuit of FIG. 6, in respects other than discussed above operates similarly to the circuit of FIG. 1.

The modifications just discussed in connection with FIG. 6 apply equally to the circuit of FIG. 5. The important advantage of these modifications are that the slave electrodes are driven at the required amplified, discrete reference levels even though the charges supplied to the master electrodes (the floating diffusions) may vary over a range of values. Further, the charge supplied to the output CCD channels automatically is standardized by a built-in fill and spill circuit to standard charge levels representing 1's and 0's. These control and signal processing functions are all integrated on to the same "chip" as the CCD electrodes.

Very high analog-to-digital translation speeds are anticipated. For example, with the circuit implemented with buried channel CCD's, it is expected that A-to-D translations can be carried out at a frequency in excess of 10 MHz. The number of CCD electrodes required is relatively small. At a 10 MHz operating speed, for example, it is calculated that with a circuit such as shown in FIG. 6, the time required to translate an analog signal to three bits in parallel will be of the order of 1 $\mu$s (conversion time). The corresponding sampling interval would be of the order of 0.1 $\mu$s.

Following is a discussion of some of the rules employed in the design of the circuits discussed. These rules are applicable both to the systems illustrated where n=3 or 4 and to systems in which n is equal to 2 or larger than 4.

Let n equal the number of output bits and m the channel number. In any design, the minimum number of parallel input channels is (n−1). Thus, in FIG. 5, for example, where n=4, there are three input channels. The first channel produces outputs which are employed to produce the $2^0$ and $2^1$ bits. Therefore, this channel may be termed the $2^2$, $2^1$ channel and it is also termed the m=1 channel. The following or m=2 channel produces the $2^2$ bit and so on.

In the m=1 input channel, there are $((2^n/4)-1)$ potential wells, each having a capacity of four charge units. These wells are followed by a single well having a capacity of at least three charge units. As applied to FIG. 5, there are $((16/4)-1=3)$ potential wells, each having a capacity of four charge units followed by one potential well having a capacity of three charge units.

The remaining input channels have one pair of potential wells with capacities $$\left[\frac{2^n}{2^{(n-m)}} - 1\right]$$

and 1, respectively. This pair of potential wells is followed by $(2^{(n-m-1)}-1)$ pairs of potential wells, each such pairs having capacities of $$\left[\frac{2^n}{2^{(n-m-1)}} - 1\right]$$

and 1, respectively. As applied to FIG. 5, in the m=3 channel, the first pair of potential wells are of capacities $$\left[\frac{2^4}{2^{(4-3)}} - 1\right]$$

and 1, respectively. There are no additional pairs of wells in the m=3 channel because $2^{(n-m)}-1=0$.

In FIG. 5, in the m=2 channel, the first pair of wells are of capacities $(2^4/2^2)-1=3$ and 1, respectively. This first pair of wells is followed by $(2^{(4-2-1)}-1)=1$ pair of wells of capacities $(2^4/2^1)-1=7$ and 1, respectively. Thus, it can be seen from this example, that the design rules hold. It can be shown that these design rules hold equally well for all values of n.

In each system, the m=1 channel is followed by a logic network shown in the dotted block LN in FIG. 5. This is the same logic network as shown in FIG. 6 although the one of FIG. 6 shows additional practical details. This logic network calculates from the output of the m=1 channel, the $2^0$ and $2^1$ bits. Indeed, this logic network is an A-to-D converter for an input having any one of four analog charge levels between zero and three arbitrary charge units. The two output bits produced are the digital equivalent of the analog charge input.

The master modes in the circuit occur in the $m=2$ and higher number channels. There is such a master node adjacent to each potential well of capacity 1. In the example of FIG. 5, there is a master node FM2 in the $m=3$ channel and two master nodes FM1 and FM3, respectively in the $m=2$ channel. There are no master nodes in the $m=1$ channel. There is a single master node in the logic network LN and it too is adjacent to a potential well of one charge unit capacity. The master node can be a floating diffusion or a floating gate, as already mentioned. In general, there will be $2^n/2^{(m+1)}$ master nodes along the m'th channel, for m larger than 1.

Let k identify the order of the master node along the length of an input channel, $k=1$ identifying the first node—the one closest to the input end of the channel, $K=2$ the following node and so on. Then for values of $m \geq 2$, the nodes in the m'th input channel can be designated by $D=2^{(m-2)}+2^{(m-1)}(k-1)$. Referring to FIG. 5, in the $m=2$ channel, there are two nodes. The first $(k=1)$ node is designated $D=2^0+2^1(1-1)=1$, that is, the first master node is the FM1 node. The second $(k=2)$ node is the $D=2^0+2^1(1)=3$, that is, the second master node is the FM3 node. In a larger system, where there are 3 master nodes in the $m=2$ channel, the third node would be the FM5 node, and so on. In the $m=3$ channel, there is one master node and the formula above indicates that it is designated by $D=2$, that is, it is the FM2 node. In a larger system with one more master node in the $m=3$ channel, it would be the FM6 node and so on.

Each input channel connects to one or more output channels. In the example of FIG. 3, there are four output channels legended OC1, OC2, OC3 and OC4, respectively, for the $m=1$ channel. Each output channel from a potential well of capacity 4 in the $m=1$ channel includes a slave gate. The slave gates in the $m=1$ channel can be numbered consecutively from 1 to $2^n/4-1$, where the number corresponds to a master node having the same number.

Each output channel for the $m=2$ input channel is coupled to a 1 unit well. Each such output channel except the last, includes a slave electrode. In general, there is a slave gate present in each output channel of a group of such channels except for the last output channel. The total number of slave gates per input channel is $2^n/2^{(m+1)}-1$, where m is the channel number.

Each master node connects to a slave node bearing the same designation number. If J is the order in which a slave gate appears along the length of an input channel, where $J=1$ is the first slave gate (closest to the input end of the channel) $J=2$ is the next slave gate, and so on, each slave gate in each channel may be designated by $D=2^{m-1}J$. Thus, as applied to FIG. 5, the $J=1$ gate in the $m=1$ channel is the $D=1$ gate, that is, the FS1 gate (and therefore it connects to the FM1 master node). The $J=2$ gate in the $m=1$ channel is the $D=2$ gate, that is, the FS2 gate, and so on. For $m=2$, the first slave gate is the $D=2$, that is the FS2 gate. In a larger system, the second slave gate is the $m=2$ channel would be the $D=4$ slave gate and so on.

The various output channels leading from an input channel merge at a common point. In the case of the $m=1$ channel, the merging point connects to the logic network LN. In the case of the remaining channels, the merging point leads to a CCD channel which produces an output bit. Thus, in the case of FIG. 5, the two output channels from the $m=2$ input channel, lead to a CCD channel which produces the $2^2$ bit.

While the design rules above provide A-to-D implementations with a minimum number of input channels, it may sometimes occur that better performance can be obtained with slight modification. For example, it may be more important to reduce the number of overflow barriers in a channel than to minimize the number of channels. This can be done by replacing a long channel with a plurality of short channels. For example, the single channel containing wells 4, 4, 4, 3 of FIG. 5, can be replaced with three input channels, the first channel having wells of capacity 4, 3; the second wells of capacities 8, 3; and the third wells of capacities 12, 3. The output channels can then be connected to the 4 and 3 wells of the first channel, the 3 well in the second channel and the 3 well in the third channel. These four output channels correspond to OC1, OC2, OC3 and OC4 of FIG. 5. It is intended in the claims which follow, that these equivalent structures be covered. Thus, for example, in those claims which call for $(n-1)$ input channels or $(n-1)$ input channel means, it is intended that the expression $m=1$ be generic to equivalent structures comprising two or more input channels which perform the same function as a single $m=1$ channel. The same holds for the other channels. In these cases an "input channel" or an "input channel means" may comprise two or more input channels.

What is claimed is:

1. A CCD analog-to-digital converter comprising, in combination:

a plurality of CCD input channel means, each including a plurality of potential wells of different size;

means for producing a plurality of charge signals, each of the same amplitude proportional to a common analog quantity, and for spilling these charge signals down the respective input channel means for supplying charge to a number of wells in each channel means dependent on the sizes of the wells and the amplitude of the charge signals;

means responsive to the presence or absence of a charge signal in a potential well in one of said input channel means for indicating the value of the most significant bit of the digital representation of said analog signal;

a plurality of CCD output channels for producing outputs indicative of the bits of lower significance of said digital representation;

means responsive to said presence of said charge signal in said potential well in said one input channel means for controlling the transfer of charge signal from a potential well in at least one remaining input channel means to at least one of said output CCD channels;

means responsive to the presence of charge in at least one of the potential wells in the remaining input channel means for controlling the transfer of charge signals to respective ones of said output channels; and means for deriving from said output channels, signals indicative of the remaining bits of said digital representation.

2. In a CCD analog-to-digital converter, in combination:

an input CCD channel means comprising electrode means providing a first potential well having a capacity of $2^{n-1}-1$ charge units followed by electrode means providing a second potential well having a capacity of at least one charge unit, and means providing a potential barrier between the two wells, where $2^n$ is equal to the number of binary values which can be represented by said converter;

means for translating an analog signal to an input charge of an amplitude representative thereof, said charge being in the range of substantially zero to substantially $2^n-1$ charge units, and for spilling said charge down said input CCD channel means;

means responsive to the presence of more than a given amount of charge in said second well for indicating one binary value as the most significant bit of n bits, and responsive to the presence of less than said given amount of charge in said second well for indicating the other binary value as the most significant of said n bits;

at least a second input CCD channel means comprising electrode means providing potential wells at least some of which are of different charge storage capacity, and means providing barriers between adjacent of such wells;

means for spilling another input charge of an amplitude representative of said analog signal down said second input CCD channel means, whereby the number of said potential wells in said second channel means which receive charge will depend on both the amplitude of said charge and the capacities of the respective potential wells of said second input channel means;

two output CCD channels;

means responsive to said charge present in said second well of the first mentioned input CCD channel means for controlling the transfer of charge from a potential well in said second input CCD channel means to one of said output CCD channels;

means for transferring the charge, if any, present in another potential well in said second input CCD channel means to said one of said output channels;

means for transferring the charge, if any, present in a potential well in said one output channel to the other output channel; and means for indicating the binary value of two lesser significant bits in response to the charges present in said two output channels.

3. An analog-to-digital converter for translating an analog signal to an n bit digital signal manifestation, where n is an integer, comprising in combination:

(n−1) CCD input channel means, the first of said channel means, hereafter termed the m=1 channel, for producing outputs indicative of the $2^0$ and the $2^1$ bits, and the m=2 to the m=(n−1) channel means for producing outputs indicative of the $2^2$ to the $2^{(n-1)}$ bits, respectively, wherein each of the m=2 through the m=n−1 channels comprises a plurality of potential wells separated by potential barriers, the first pair of such wells having capacities of $$\left[\frac{2^n}{2^{(n-m)}}-1\right]$$

and 1 arbitrary charge units, respectively, and being arranged in the other stated, and being followed by $[2^{(n-m-1)}-1]$ pairs of potential wells of capacities $$\left[\frac{2^n}{2^{(n-m-1)}}-1\right]$$

and 1, respectively, arranged in the order stated, where m is the channel number, and wherein the m=1 input channel comprises a plurality of potential wells separated by potential barriers, at least some of said potential wells being of different size from other of the potential wells in said m=1 channel and which have a combined storage capacity of at least $(2^n-1)$ arbitrary charge units, where $(2^n-1)$ such arbitrary charge units represents the analog signal of maximum amplitude which is to be translated;

means responsive to an analog input signal for spilling charge down each input channel of an amplitude proportional to the amplitude of the input signal and in the range of substantially 0 to substantially $(2^n-1)$ arbitrary charge units, whereby the number of potential wells in each input channel which receive charge charge will depend upon the amplitude of the charge and the capacities of the potential wells into which the charge spills;

means including the m=1 channel for producing outputs indicative of the $2^0$ and $2^1$ bits of said digital signal manifestation; and means for producing outputs from the m=2 to the m=n−1 input channels indicative of the $2^2$ to the $2^{n-1}$ bits of said digital signal manifestation.

4. An analog-to-digital converter as set forth in claim 3 wherein said m=1 CCD input channel comprises:

$(2^n/4-1)$ potential wells, each having a charge storage capacity of four charge units followed by at least a single potential well having a charge storage capacity of at least three arbitrary charge units.

5. An analog-to-digital converter as set forth in claim 3 wherein said means for producing outputs indicative of the $2^0$ and $2^1$ bits comprises:

a logic network which receives charge from a selected one of the potential wells in said m=1 input channel dependent upon the levels of charge present in at least one potential well in at least one other input channel means, said logic network comprising a plurality of CCD output channels.

6. An analog-to-digital converter as set forth in claim 5 wherein:

said m=1 channel means comprises means for selectively supplying to said logic network a charge of an amplitude in the range of substantially 0 to substantially 3 arbitrary charge units and wherein:

said logic network comprises means for deriving from the charge it receives from the m=1 channel a two bit signal manifestation indicative of the amplitude of said charge.

7. In a CCD analog-to-digital converter, in combination:

an input CCD channel means comprising electrode means providing a first potential well having a capacity of $2^{n-1}-1$ charge units followed by electrode means providing a second potential well having a capacity of at least one charge unit, and means providing a potential barrier between the two wells, where $2^n$ is equal to the number of binary values which can be represented by said converter;

means for translating an analog signal to an input charge of an amplitude representative thereof, said charge being in the range of substantially zero to substantially $2^{n-1}$ charge units, and for spilling said charge down said CCD channel means;

means responsive to the presence of more than a given amount of charge in said second well for indicating one binary value as the most significant bit of n bits, and responsive to the presence of less than said given amount of charge in said second well for indicating the other binary value as the most significant of said n bits;

means responsive to said input charge and to the level of charge in said second potential well for indicating the binary values of the remaining (n−1) of said bits, said means comprising at least a second input CCD channel means this one comprising electrode means providing potential wells at least some of which are of different charge storage capacity and means providing potential barriers between adjacent ones of said wells;

means for spilling another charge of an amplitude equal to said input charge down said second input CCD channel means for supplying charge to a number of potential in said second channel means dependent upon the capacities of said wells and the amplitude of said charge; and means for deriving from said second channel means and from a control signal indicative of the level of charge present in said second well, indications of the binary values of at least two of said n bits of lower significance than the most significant of said n bits.

8. An analog-to-digital converter for translating an input charge in the range substantially 0 to substantially three arbitrary charge units to a two bit signal manifestation comprising:

a first CCD channel comprising potential wells having capacities of two and one arbitrary charge units, respectively, arranged in that order, separated from one another by potential barriers;

a second CCD channel comprising a potential well having a capacity of one arbitrary charge unit;

a third CCD channel comprising a potential well having a capacity of one arbitrary charge unit;

means for spilling said input charge down said first channel, the well of capacity two being closer to the input end of said first channel than the well of capacity 1;

means for transferring the charge, if any, present in well of capacity two in said first channel to the well in said second channel and the excess, if any, to the well in said third channel;

means responsive to the presence of charge of greater than a given level in the well of capacity one in said first channel for indicating that the $2^0$ bit is of one binary value;

means responsive to the presence of charge of greater than a given level in the potential well in said second channel and the absence of charge of greater than a given level in said well in said third channel for indicating that the $2^0$ bit is of said one binary value;

means responsive to the presence of charge of greater than a given value in the potential well in said third channel for indicating that the $2^1$ bit is of said one binary value and to the presence of charge of less than said given value in the potential well in said third channel for indicating that the $2^1$ bit is of the other binary value; and means responsive to the presence of charge of less than a given value in both the potential well in said second channel and the potential well of capacity one in said first channel for indicating that the $2^0$ bit is of said other binary value.

9. An analog-to-digital converter as set forth in claim 8 wherein said means responsive to the charge in said potential well in said third channel comprises an electrically floating element, and gate electrode means coupled to said floating element for controlling the transfer of charge from the potential well in said second channel.

* * * * *

UNITED STATES PATENT AND TRADEMARK OFFICE
CERTIFICATE OF CORRECTION

PATENT NO. : 4,206,446

DATED : June 3, 1980

INVENTOR(S) : Leonard R. Rockett, Jr.

It is certified that error appears in the above-identified patent and that said Letters Patent is hereby corrected as shown below:

Abstract, line 7, "with" should be --will--.

Column 2, line 24, "electrodes" should be --electrode--.

Column 4, line 2, after "excess" insert --charge--.

Column 4, line 62, "to", second occurrence should be -- of --.

Column 5, line 48, "anitcipation" should be --anticipation--.

Column 8, line 22, "circuts" should be --circuits--.

Column 8, line 66, "referene" should be --reference--.

Column 10, line 14, "$T_{44}$" should be --$t_{44}$--.

Column 11, lines 22 and 23, "transistors" should be --transistor--.

Column 12, line 19, "$2^2$" should be --$2^0$--.

Column 12, line 39, "pairs" should be --pair--.

Column 13, line 4, "modes" should be --nodes--.

UNITED STATES PATENT AND TRADEMARK OFFICE
CERTIFICATE OF CORRECTION

PATENT NO. : 4,206,446

DATED : June 3, 1980

INVENTOR(S) : Leonard R. Rockett, Jr.

It is certified that error appears in the above-identified patent and that said Letters Patent is hereby corrected as shown below:

Column 17, line 29, (claim 7), after "potential" insert

--wells--.

Signed and Sealed this

Seventh Day of October 1980

[SEAL]

Attest:

SIDNEY A. DIAMOND

Attesting Officer

Commissioner of Patents and Trademarks